(12) United States Patent
Kumamoto

(10) Patent No.: US 7,071,572 B2
(45) Date of Patent: **\*Jul. 4, 2006**

(54) PRE-BACK-GRIND AND UNDERFILL LAYER FOR BUMPED WAFERS AND DIES

(75) Inventor: Takashi Kumamoto, Tsukuba (JP)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/910,933

(22) Filed: Aug. 3, 2004

(65) Prior Publication Data

US 2005/0006767 A1    Jan. 13, 2005

Related U.S. Application Data

(63) Continuation of application No. 09/893,588, filed on Jun. 29, 2001, now Pat. No. 6,794,751.

(51) Int. Cl.
*H01L 23/48* (2006.01)
*H01L 21/48* (2006.01)

(52) U.S. Cl. .............. 257/778; 257/783; 438/114; 438/459; 438/460

(58) Field of Classification Search ........... 257/738, 257/752, 753, 778–780, 782, 783; 438/126, 438/127

See application file for complete search history.

(56) References Cited

U.S. PATENT DOCUMENTS

| 6,060,373 | A | 5/2000 | Saitoh |
|---|---|---|---|
| 6,107,164 | A | 8/2000 | Ohuchi |
| 6,338,980 | B1 | 1/2002 | Saitoh |
| 6,342,434 | B1 * | 1/2002 | Miyamoto et al. .......... 438/464 |
| 6,347,947 | B1 | 2/2002 | Ong |
| 6,465,330 | B1 | 10/2002 | Takahashi et al. |
| 6,506,681 | B1 | 1/2003 | Grigg et al. |
| 6,649,445 | B1 * | 11/2003 | Qi et al. ..................... 438/108 |
| 6,777,313 | B1 * | 8/2004 | Takyu et al. ................ 438/464 |
| 6,794,751 | B1 * | 9/2004 | Kumamoto ................ 257/738 |
| 2001/0036711 | A1 | 11/2001 | Urushima |
| 2002/0068453 | A1 | 6/2002 | Grigg et al. |
| 2002/0166625 | A1 | 11/2002 | Ball et al. |

FOREIGN PATENT DOCUMENTS

JP          11320962 A   * 11/1999
WO         WO 02/23592      3/2002

* cited by examiner

*Primary Examiner*—Alonzo Chambliss
(74) *Attorney, Agent, or Firm*—Blayne D. Green

(57) ABSTRACT

Multi-purpose planarizing/back-grind/pre-under-fill arrangements for bumped wafers and dies, in which a planarizing coating provides improved and continued surface protection to the circuit surface of a wafer or die throughout back-grinding and subsequent mounting operations, and provides improved stiffening/strengthening of the wafer and die throughout back-grinding and subsequent mounting operations.

23 Claims, 5 Drawing Sheets

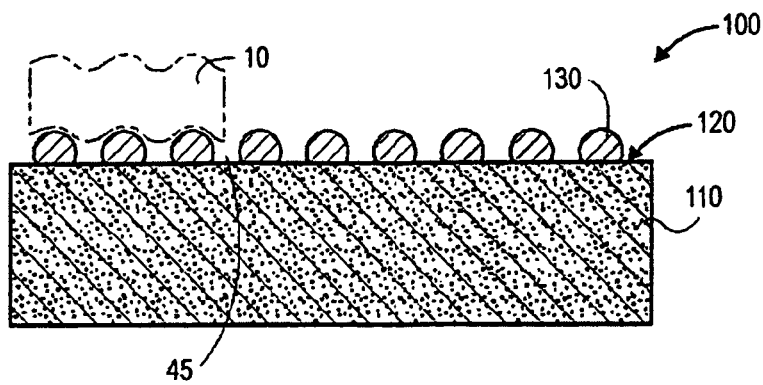
FIG. 1 – PRIOR ART
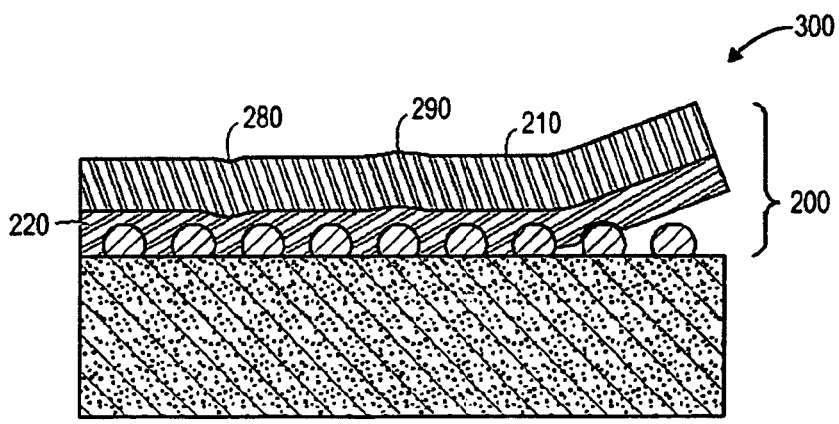
FIG. 2 – PRIOR ART
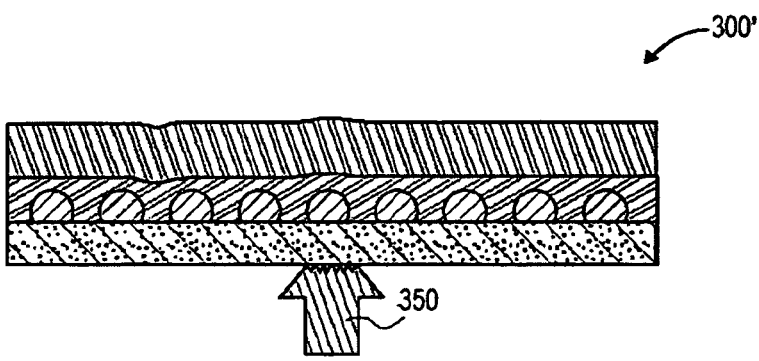
FIG. 3 – PRIOR ART
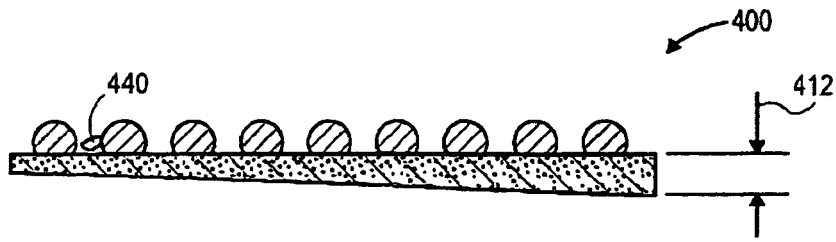
FIG. 4 – PRIOR ART

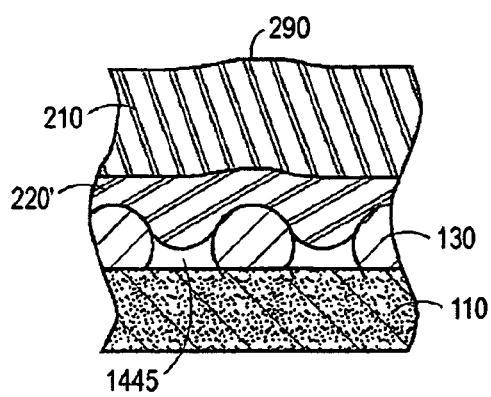 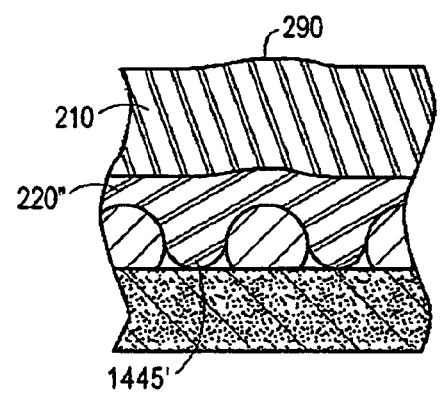
FIG. 14
PRIOR ART
FIG. 15

PRE-BACK-GRIND AND UNDERFILL LAYER FOR BUMPED WAFERS AND DIES

RELATED APPLICATIONS

This application is a continuation of and claims priority to U.S. patent application Ser. No. 09/893,588 filed on Jun. 29, 2001 now U.S. Pat. No. 6,794,751 entitled "Multi-Purpose Planarizing/Back-Grind/Pre-Underfill Arrangements for Bumped Wafers and Dies," which is incorporated herein by reference in its entirety.

FIELD

The present invention is directed to multi-purpose planarizing/back-grind/pre-under-fill arrangements for bumped wafers and dies.

BACKGROUND

Mounting and packaging technologies of semiconductor circuits appear to be continuously in transition, with the continuing goal to achieve, for example, greater ease, lower manufacturing costs, and more reliable mounting and packaging arrangements. One such technology is that of bumped wafer and bumped die technology. Needed are improvements to the mounting and packaging arrangements for bumped wafers and very thin bumped die.

BRIEF DESCRIPTION OF THE DRAWINGS

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and that the invention is not limited thereto. The spirit and scope of the present invention are limited only by the terms of the appended claims. The following represents brief descriptions of the drawings, wherein:

FIG. 1 relates to a simplistic illustration of an example solder-bumped wafer useful in explanation/understanding of background and embodiments of the present invention;

FIG. 2 relates to a simplistic illustration of an example flexible-layer taped wafer, useful in explanation/understanding of background and embodiments of the present invention;

FIG. 3 relates to a simplistic illustration of an example back-grind process applied to the FIG. 2 taped wafer arrangement;

FIG. 4 relates to a simplistic illustration of an example de-taped, thinned bumped wafer after the back-grind operation of FIG. 3;

FIG. 14 is an enlarged view of an example portion of the flexible layer taped arrangement of FIG. 2 for the purpose of illustrating a disadvantageous air gap; and FIG. 15 is similar to FIG. 14, but is illustrative of a more advantageous, flexible layer having a smaller air gap.

DETAILED DESCRIPTION

Figure 5A:
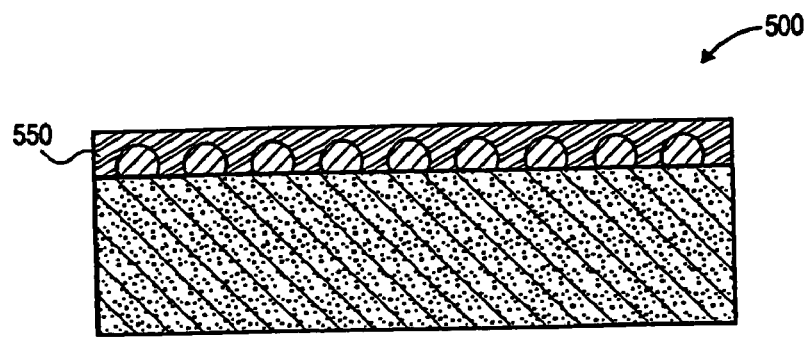
FIGS. 5A and 5B relate to simplistic illustrations of example solder-bumped wafers having example planarizing/pre-backfill coatings of the present invention, i.e., relate to planarizing/pre-backfilled wafers.

Before beginning a detailed description of the subject invention, mention of the following is in order. When appropriate, like reference numerals and characters may be used to designate identical, corresponding or similar components in differing figure drawings. Further, in the detailed description to follow, example dimensions/models/values/ranges/materials may be given, although the present invention is not limited to the same. Further, arrangements may be shown in simplistic or block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Further, where specific details are set forth in order to describe example embodiments of the invention, it should be apparent to one skilled in the art that the invention can be practiced without, or with variation of, these specific details.

The description now turns to explanations useful in an understanding of the present invention. More particularly, the present invention is useful in any type of arrangement wherein it is useful to planarize or level and also pre-underfill any type of wafer arrangement which has protrusions (e.g., solder bumps), and which may be subjected to a back-grind process. While background and example embodiments of the present invention are described with respect to an example solder-bumped wafer and die, practice of the present invention is not limited thereto (e.g., embodiments of the present invention may have uses with wafers and dies having other types of non-planarities, e.g., wafers and dies having protruding metal interconnect lines, capacitors, etc.). Further, while background and example embodiments of the present invention are described with a very thin die used as a flip chip mounted to a landed substrate, practice of the present invention is not limited thereto (e.g., the present invention may have other uses, such as multi-stacked die arrangements).

Turning now to detailed discussion of example embodiments, FIG. 1 relates to a simplistic illustration of an example solder-bumped wafer useful in explanation/understanding of background and embodiments of the present invention. More particularly, illustrated is a bumped wafer arrangement 100, for example, a solder-bumped wafer constructed of a substrate (e.g., a semiconductor wafer) 110 having a circuit surface 120 and bumps 130 protruding therefrom. The bumps 130 may be of any size, for example, may have a height within a range of 30–150 µm, or more specifically, 120 µm, and may have a width within any range, for example, such as 30–170 µm, or more specifically, 150 µm. Oftentimes in semiconductor manufacturing, it is desirable to polish or grind down a backside of the substrate 110 such that an overall thickness of the substrate 110 becomes much thinner, e.g., 125 µm. The advantage of grinding to a very thin substrate is that any resultant die devices may be more compactly mounted within an end package, thereby reducing size, weight, etc.

Several situations require special considerations with respect to back-grinding substrates. More particularly, as one consideration, care must be taken such that byproducts from the back-grind process do not contaminate the circuit surface. For example, non-conductive particles from the back-grind process may interfere with subsequent electrical conduction interconnections between conductive arrangements (e.g., between a conductive solder bump and a substrate land). As another example, conductive particles may cause short-circuiting between electrical circuits of the circuit surface 120. Still further, chemicals from the back-grind process may have a disadvantageous chemical effect on the circuit surface 120. Thus, it is important that the circuit surface 120 be adequately protected.

As another consideration, some type of arrangement must be used as a holding mechanism to hold the bump wafer 100 in place while a back-grind process is applied thereto. Oftentimes, a tape arrangement (e.g., an adhesive tape) is applied to the bumped wafer 100 for the dual purpose of holding the bumped wafer 100 in place while a back-grind process is applied, and providing surface protection (e.g., from contaminants) to the circuit surface 120. FIG. 1 illustrates an example embodiment in dashed-line form of a tape 10 having an adhesive thereon, which sticks to any bump 130 or circuit surface 120 coming into contact therewith.

While the tape 10 having a simple adhesive thereon works well with respect to planar wafers, such tape 10 does not work well with bumped wafers for a number of reasons. As one reason, the tape 10 is not sufficiently fluid/flexible to dip within the valleys between the bumps 130, and accordingly, substantial air gaps 45 (FIG. 1) are formed between neighboring bumps 130, the circuit surface 120 and the tape 10. The problem is that insufficient circuit surface 120 protection is provided, in that byproducts (e.g., non-conductive particles, conductive particles and chemicals) from the back-grind process can enter the air gaps 45, to be disadvantageously contained therein. As a further problem, the albeit-limited flexibility of the tape 10 allows it to dip slightly down in between neighboring bumps 130, resulting in a wavy, non-planar tape surface. The problem with the non-planar tape surface is that, when pressure is applied during the back-grind process, such pressure will be applied significantly unevenly across the bumped wafer 100, and as the wafer is thinned during the back-grind process, mechanical damage such as cracking of the wafer often occurs. Such may also disadvantageously enlarge a total wafer thickness variation after a back-grind process.

Still further, during the bump manufacturing process, oftentimes the resultant bumps (e.g., solder bumps) have significant height differentials between the respective bumps. Any bump having a significantly higher height difference than neighboring bumps runs the risk of being a point of highly-localized pressure from the back-grind process, resulting in dimpling (not shown) and/or cracking (not shown) of the bumped wafer 100 as it becomes thinned during the back-grind process. That is, the FIG. 1 tape 10 arrangement provides inferior compensation for differences with respect to bump height between the respective bumps.

Discussion now turns to FIG. 2. More particularly, FIG. 2 relates to a simplistic illustration of an example flexible-layer taped wafer useful in explanation/understanding of background and embodiments of the present invention. More particularly, FIG. 2 is directed to a surface protection tape having a flexible or conforming layer which attempts to overcome the shortcomings of the FIG. 1 arrangement, e.g., attempts to avoid mechanical wafer damage such as wafer breakage and dimpling of the wafer backside, provide compensation for differences in bump height, and provide protection to the circuit surface 120 from contamination.

Turning to more detailed discussion, the FIG. 2 wafer arrangement 300 includes a surface protection tape 200 which includes a backing layer 210 and a flexible or conforming layer 220. With respect to the flexible/conforming layer 220, such layer should be composed of an adhesive material having conforming characteristics such that, as the conforming protection surface tape 200 is applied to the bumped wafer, the result is a taped wafer 300, wherein the conforming layer 220 is substantially conformed to the bumps 130. More specifically, turning attention briefly to the magnified view in FIG. 14, there is illustrated a disadvantageous arrangement wherein a conforming layer 220' has conforming characteristics which are too stiff, such that the conforming layer 220' dips insufficiently between neighboring bumps 130 such that there is still resultant air gaps 1445. Again, such air gaps 1445 allow byproducts from the back-grind process to potentially contaminate the circuit surface 120. FIG. 15 illustrates a more advantageous arrangement wherein the conforming layer 220" has conforming characteristics which are sufficiently flexible so as to substantially completely dip between neighboring bumps 130 such that there are negligible air gaps 1445' formed. A result of the flexible/conforming layer is a taped arrangement having improved planarity over that of the simple adhesive tape.

Returning discussion to FIG. 2, once the conforming surface protection tape 200 is completely applied to the wafer 300, the tape 200 is used to hold the wafer during the back-grind process and, in FIG. 3, a back-grind process 350 is shown being applied to result in a back-grind or thinned wafer 300'. After the back-grind process 350 is completed, the conforming surface protection tape 200 is removed, to result in a de-taped, thinned bumped wafer 400, as illustrated in FIG. 4.

The conforming surface protection tape arrangement is disadvantageous in a number of ways. As a first disadvantage, a thickness of the flexible/conforming layer 220 must be carefully chosen in relation to a height of the bumps 130 in order for the approach to provide somewhat satisfactory results. For example, in the aforementioned example of a bump height of 120 µm, a suitable flexible/conforming layer 220 thickness may be approximately 150 µm. If the flexible/conforming layer 220 thickness is incorrectly selected, non-planar features such as the FIG. 2 dips 280 and rises or swellings 290 may occur, to result in the aforementioned localized pressure, e.g., dimpling and breakage, problems. As the flexible/conforming layer 220 must be chosen to be carefully related to the bump height, disadvantageously, a large inventory of conforming surface protection tapes 200 having varying flexible/conforming layer 220 thicknesses must be maintained. Even if the flexible/conforming layer 220 thickness is carefully chosen with respect to a majority of areas of the bumped wafer 100, sporadic non-planar features such as dips 280 and rises 290 still may occur. Accordingly, special back-grind handling is required with respect to the conforming surface protection tape arrangement, in that grinding/polishing rates are very sensitive to surface planarity of the taped wafer.

Accordingly, as a result of the above disadvantages, manufacturing is slowed and costs are increased as time must be taken to carefully select a thickness of the flexible/conforming layer 220, and then a slower, more careful back-grind process must be applied. If dips 280 or rises 290 do occur, or if insufficiently careful back-grinding is applied to the conforming surface protection tape arrangement, a result may very well be a thinned wafer having, or being prone to, mechanical damage. More particularly, FIG. 4 illustrates a thinned wafer 400 wherein, instead of having a uniform thickness goal of 125 µm across the wafer, a thickness 412 thereof is unequal. Such an unequal-thickness wafer is subjected to differing stresses along a body thereof during subsequent back-grinding, de-taping, dicing, die mounting and circuit operation, so there is a significant potential for thinned wafer cracking.

As a further disadvantage, the conforming surface protection tape is very difficult to remove during a required de-taping operation. More specifically, once the conforming layer 220 has conformed to (e.g., surrounds) the bumps 130, such bumps act as anchors. That is, adhesion and suction forces make it difficult to remove the conforming surface protection tape 200, and may result in localized pressures during the de-taping process. A very distinct possibility is breakage of the thinned wafer 400.

A further disadvantage of the conforming surface protection tape arrangement is that of leftover residue. More specifically, due to the aforementioned adhesion and suction characteristics of the conforming layer 220, fragments 440 (FIG. 4) of the conforming layer 220 may be left on the bumps 130 or the circuit surface 120. Such residue requires further cleaning (e.g., such as washing) of the thinned wafer 400. Additional washing results in additional manufacturing time and costs, and subjects the circuit surface 120 to additional stresses and exposure. Inadequate cleaning and any un-removed residue 440 may disadvantageously affect any subsequent die bonding or mounting operations.

Discussion now turns to example embodiments of the present invention. More specifically, attention is directed to FIG. 5A, illustrating a planarized/pre-back-filled bumped wafer 500. More specifically, the bumped wafer 500 has a planarized/pre-back-filled coating 550 applied thereto. Such coating may, for example, be a polymer coating applied via a non-conductive or anisotropic film/paste. Still further, the coating 550 may be a thermoplastic material. The coating may be applied through any known technique, for example, via a non-exhaustive listing including: a flow process, an injection molding, or a hot vacuum lamination.

Figure 5B:
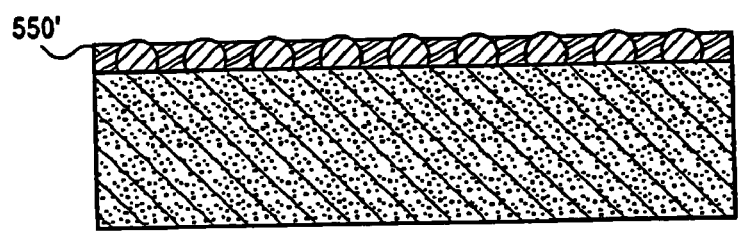

FIG. 5A shows an arrangement 500 wherein the coating 550 completely covers, i.e., is thicker in thickness than, the bumps 130. FIG. 5B shows an alternative arrangement wherein the coating 550' is applied to have a thickness which is level with or slightly thinner than a height of the bumps 130 such that the tops of the bumps 130 are accessible. Advantages of the FIG. 5B arrangement is that the exposed bump 130 areas can serve as adhesion points for an adhesive tape (especially where a non-adhering thermoset coating 550' is used), and the exposed bump portions remain uncontaminated by the coating 550' so as to possibly result in better bonding thereof with any interconnecting lands.

The coating 550' again may be a polymer coating, and may be either a thermoplastic or thermoset polymer. Use of thermoplastic or thermoset coatings is advantageous in that thermoplastic and thermoset molding technology on bumped-surface wafers already exists in the semiconductor industry, for example, is used in the encapsulation of wafer-level packages. As an alternative, the coating, instead of being a thermoplastic or thermoset material, may instead be able to be of a material capable of light curing or chemical curing.

As a further possible advantageous arrangement, the coating may be opaque, so as to protect the circuit surface 120 from undesirable influences such as light, or ultraviolet (UV) light or radiation. Use of an opaque coating may be advantageous in that a tape (discussed hereinafter) which is curable via UV light may be used so as to be easily removable from a thinned wafer. As an alternative to opaqueness, the coating may instead be of a transparent material so as to allow light, UV light or radiation to travel thereto, so as to be applied to the circuit surface 120, or alternatively, to travel from the circuit surface 120 toward any substrate or other circuit bonded to the resultant bumped die. As a further alternative, the coating may be selectively opaque in some regions and selectively transparent in other regions. Further, while the coating 550/550' should generally be of a non-conductive material, the coating may contain conductive areas if appropriate, e.g., to provide electrical conduction paths between differing areas of the circuit surface 120, or between the circuit surface 120 and a substrate or circuit bonded to the resultant bumped die. The coating also may have other characteristics which provide other types of protection.

The planarized/pre-back-filled coating arrangements of FIGS. 5A and 5B are advantageous in that the coating layer 550/550' provides compensation for bump height differences, and an improved planar (or leveled) surface allows applied pressure to be uniform across the wafer during the back-grind process. Further, the thickness of the coating can be changed quickly and easily in real time during the manufacturing process by simply changing an amount of coating material applied to the bumped wafer 100. Further, planar surface enhancing procedures also may be applied to further enhance the uniform planar surface of the planarized/backfilled bumped wafer, e.g., vibration may be applied to planarize the coating, or a sufficient time may be allowed for planarizing flow of the coating.

Figure 6:
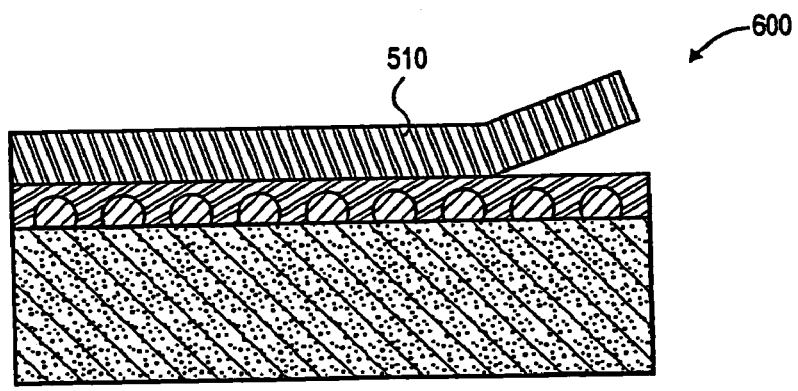
FIG. 6 relates to a simplistic illustration of an example taped, planarized/pre-backfilled wafer of the present invention.
Figure 7:
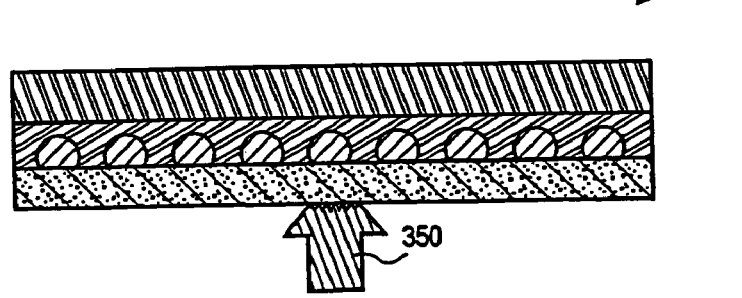
FIG. 7 relates to a simplistic illustration of an example back-grind process being applied to the FIG. 6 taped wafer.

Continuing discussion with FIG. 6, once a coating has been applied and sufficiently planarized, a tape 510 with adhesive is applied to the wafer 600 for surface protection. If the FIG. 5A arrangement is used, then a simple adhesive tape may be applied. If the FIG. 5B arrangement is used, then a simple adhesive tape may be used, or alternatively, a conforming tape with a flexible/conforming layer to provide further planarizing compensation for the slightly exposed bumps may be used. The result is a taped/planarized/back-filled bumped wafer 600' having a superior planar surface (FIG. 7). The bumped wafer 600' then has the back-grind process 350 applied thereto. Due to the superior planarizing of the above-described approach, the bumped wafer 600' can effectively be treated as a non-bumped wafer during any back-grind process, such that general back-grinding without special precautions can be quickly and easily performed, with shorter manufacturing time. Further, due to the increased stiffness provided by the planarized/pre-backfilled coating, a strength of the back-grind or thinned wafer 600' is advantageously enhanced.

Figure 8:
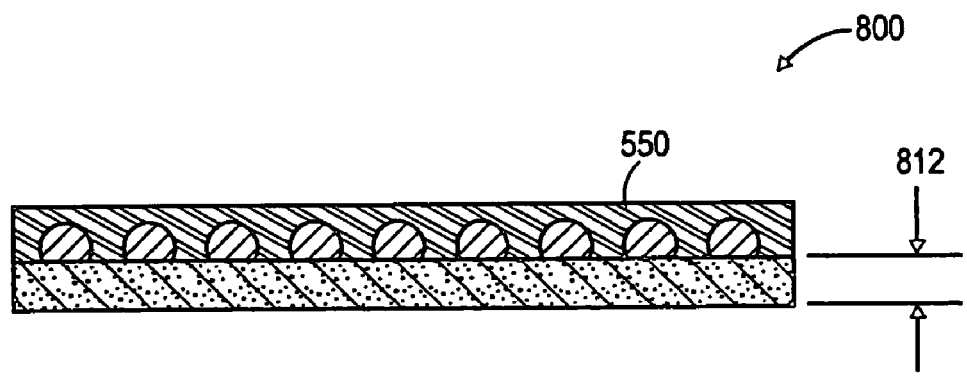
FIG. 8 relates to a simplistic illustration of an example de-taped, thinned bumped wafer after the FIG. 7 back-grind process.

Once the FIG. 7 back-grinding process 350 is completed, a de-taping process can be applied, to result in the de-taped, thinned bumped wafer 800 in FIG. 8. With respect to de-taping, as mentioned previously, if the coating is advantageously of an opaque material, UV light can be applied to remove any UV-curable adhesive tape, so as to make the tape 510 more easily removable with lessened pressure, so as to further minimize any mechanical damage potential to the thinned bumped wafer 800. The end result is the thinned bumped wafer 800, having a thickness 812 of, for example, 125 μm, and which possibly can be made even thinner (e.g., 100 μm) than the aforementioned background approaches, owing to the increased stiffness afforded by the coating, and which is more equal throughout its area.

Turning now to discussion of a further difference from the aforementioned FIGS. 2–4 background approaches, unlike the conforming layer 220 being removed (FIG. 4), the coating layer 550/550' remains on the thinned bumped wafer 800 in FIG. 8. Again, the coating 550/550' continues to provide the advantage of increased stiffness to the thinned bump wafer 800, so as to advantageously continue to provide increased mechanical damage protection (and possible optical protection (if opaque)) to the wafer during subsequent handling.

Further, it should be apparent at this point that the coating 550/550' should advantageously be made of a suitable under-fill material. More specifically, discussion now turns to FIG. 9, which relates to a simplistic illustration of an example diced die from the FIG. 8 wafer being used in an example flip chip manner, in preparation for bonding to a substrate, and still maintaining the pre-backfill coating of the present invention. That is, in FIG. 9, the thinned bump wafer 800 of FIG. 8 has been diced, and a single die 800' has been flipped together with its planarized/pre-backfill coating 550/550', and aligned with, for example, a printed wiring board (PWB) 900, so as to begin a flip chip mounting process.

More specifically, the PWB 900 includes a substrate 960 and flip chip lands 970, which are aligned with respective bumps 130 of the die 800'. It should be noted with respect to FIG. 9 that no additional adhesive is applied to either the bumped die 800' or the PWB 900, i.e., the planarizing/pre-backfill coating 550/550' will be used to effect the flip chip assembly bonding. More specifically, the die 800' and PWB 900 are brought together, and heat and pressure are then applied so as to plasticize the coating 550/550' such that the coating will flow and under-fill areas between the bumps 130 and flip chip lands 970, while allowing opposing bumps 130 and lands 970 to electrically interconnect. As a further advantage, because the bumps are covered with a coating (e.g., a polymer), before flip chip interconnection solder, solder flow is controlled even without resist. Such enables flip chip joining on copper foil even where pads have not been patterned. Once the heating is removed, the plasticized coating 550 of FIG. 9 de-plasticizes, so as to cause the die 800' and PWB 900 to adhere to one another. The result is the very thin die flip chip assembly 1000 of FIG. 10.

Figure 9:
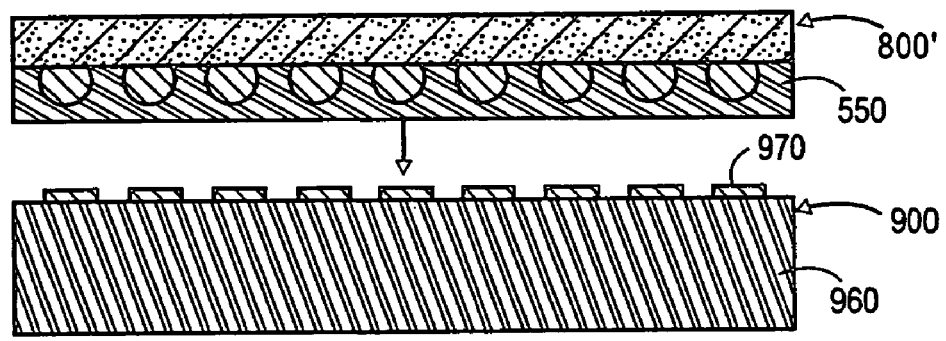
FIG. 9 relates to a simplistic illustration of an example diced die from the FIG. 8 wafer being used in an example flip chip manner, in preparation for bonding to a substrate, and still maintaining the pre-backfill coating of the present invention.
Figure 10:
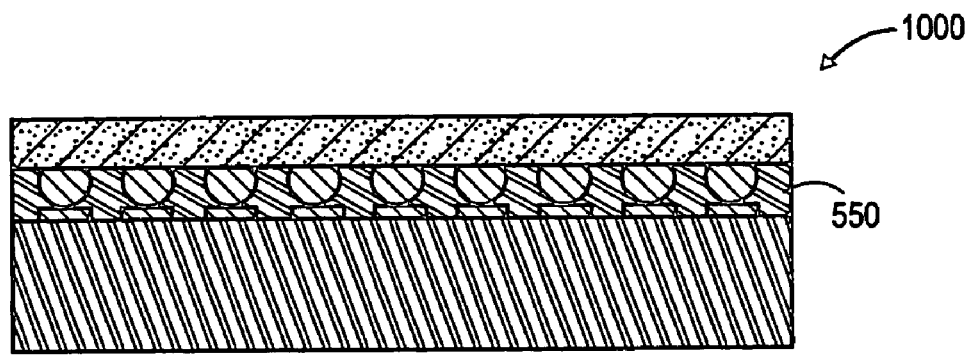
FIG. 10 relates to a simplistic illustration of an example bonded flip chip after flip chip joining.
Figure 11:
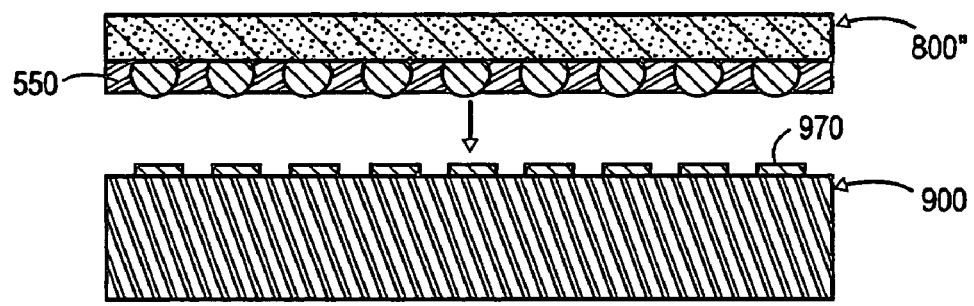
FIG. 11 relates to a simplistic illustration of another example embodiment of a diced die being used in an example flip chip manner for bonding to a substrate.
Figure 12:
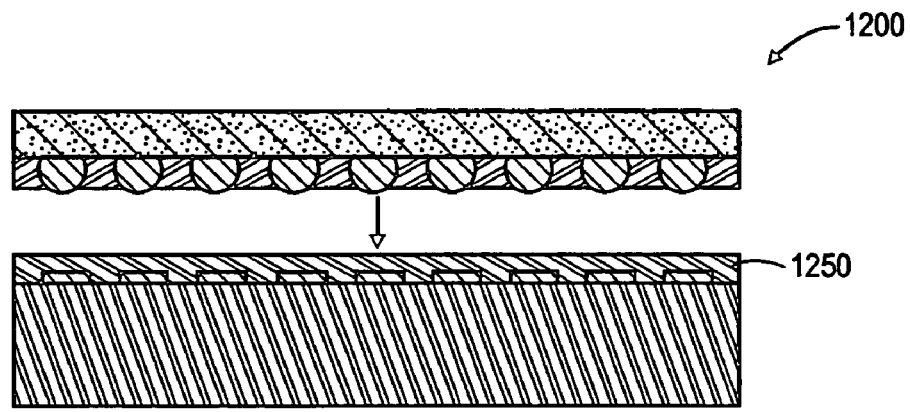
FIG. 12 relates to a simplistic illustration of an example adhesive layer applied between the flip chip die and the substrate from FIG. 11.
Figure 13:
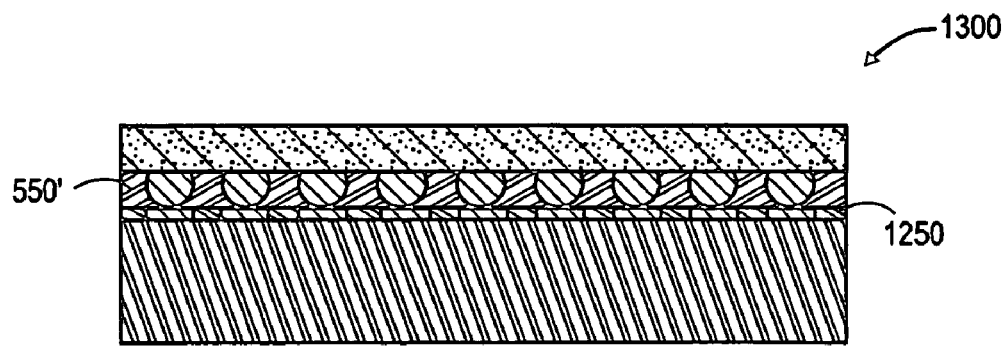
FIG. 13 relates to a simplistic illustration of an example very thin die flip chip assembly after flip chip joining using the adhesive layer of FIG. 12.

Discussion turns next to FIGS. 11–13. More specifically, discussions with respect to FIGS. 11–13 would substantially parallel the discussions with respect to FIGS. 9 and 10 and, accordingly, redundancy is omitted for the sake of brevity. The differences between FIGS. 11–13 versus FIGS. 9 and 10 are that the thinner coating 550' of FIG. 5B is illustrated/used together with an additional adhesive layer 1250 (FIG. 12) for use in the flip chip assembly process. The adhesive layer 1250 can be made of any suitable material, e.g., may be made of the same material as the coating 550, 550', such as a thermoplastic or thermoset polymer. As advantages, the adhesive coating 1250 is used to compensate for the fact that the planarized/pre-backfill coating 550' does not completely cover the bumps 130, and additional under-fill material is needed to fill in areas between the flip chip lands 970 and/or the remaining height of the bumps 130. The adhesive coating 1250 thus effectively serves as a secondary under-fill layer. The final result is the alternative very thin die flip chip assembly 1300, as illustrated in FIG. 13.

Applicant's invention, including the planarized/backfill coating, provides at least the following, non-exhaustive advantages with respect to the back-grinding and mounting operations: pre-backfilling at an early stage of manufacturing; improved planarizing (or leveling) of the bumped wafer; improved and continued surface protection to the circuit surface 120 throughout the back-grinding and subsequent mounting operations via the pre-backfill material; improved stiffening/strengthening of the wafer and die throughout the back-grinding and mounting operations via the pre-backfill material; improved light/UV/radiation protection to the circuit surface throughout the back-grinding and mounting operations via the pre-backfill material; and a easily-stored and versatile coating material having an application thickness which is easily controlled.

In concluding, reference in the specification to "one embodiment", "an embodiment", "example embodiment", etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments. Furthermore, for ease of understanding, certain method procedures may have been delineated as separate procedures; however, these separately delineated procedures should not be construed as necessarily order dependent in their performance, i.e., some procedures may be able to be performed in an alternative ordering, simultaneously, etc.

This concludes the description of the example embodiments. Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

For example, while the above example embodiments are described as applying a back-grind process to a layered wafer and then dicing the wafer to achieve individual die, it is envisioned that such operations may be reversed, i.e., the layered wafer may first be subjected to dicing to achieve individual die, and then individual die subjected to a back-grind process. This is advantageous in situations where only certain types of die from a multi-die-type wafer need to be back-grinded. Further, there is envisioned a multi-stage back-grind process where back-grind process is first applied to a layered wafer, then dicing of the wafer to achieve individual die, and finally, individual die subjected to a further back-grind process. Note that such multi-stage back-grind process may be made possible by the extra rigidity support provided by the pre-back-grind under-fill layer of the present invention.

What is claimed is:

1. An apparatus comprising:
   a pre-back-grind under-fill layer on a surface of a die or a wafer having a bump, wherein the pre-back-grind under-fill layer provides both substantially planar back-grind support during a back-grind process and under-fill material during a mounting/under-fill process, wherein the pre-back-grind under-fill layer entirely covers the bump.

2. An apparatus as claimed in claim 1, further comprising:
   an adhesive protection tape applied to the pre-back-grind under-fill layer.

3. An apparatus as claimed in claim 1, wherein the pre-back-grind under-fill layer has a thickness beyond a height thickness of the bump to provide additional material to under-fill structures other than the bumps during the mounting/under-fill process.

4. An apparatus as claimed in claim 1, wherein the pre-back-grind under-fill layer comprises a polymer material.

5. An apparatus as claimed in claim 1, wherein the pre-back-grind under-fill layer comprises a thermoplastic material.

6. An apparatus as claimed in claim 1, wherein the pre-back-grind under-fill layer comprises one of a light-curable material or a chemical-curable material.

7. An apparatus as claimed in claim 1, wherein the pre-back-grind under-fill layer comprises an opaque material to provide at least one of light, ultra-violet (UV) light, or radiation protection to the surface.

8. A back-grind/mounting method useable with either one of a bumped-die or a bumped wafer comprising:
   providing a pre-back-grind under-fill layer on the bumped-die or bumped wafer to provide both substantially planar back-grind wafer support during a back-grind process and under-fill material during a mounting/under-fill process, wherein the pre-back-grind under-fill layer entirely covers a bump on the bumped-die or bumped wafer.

9. A method as claimed in claim 8, further comprising:
   providing an adhesive protection tape to the pre-back-grind under-fill layer.

10. A method as claimed in claim 8, wherein the pre-back-grind under-fill layer has a thickness beyond a height thickness of the bump to provide additional under-fill material to an under-fill structure other than the bump during a mounting process.

11. A method as claimed in claim 8, wherein the pre-back-grind under-fill layer comprises a polymer material.

12. A method as claimed in claim 8, wherein the pre-back-grind under-fill layer comprises a thermoplastic material.

13. A method as claimed in claim 8, wherein the pre-back-grind under-fill layer comprises one of a light-curable material or a chemical-curable material.

14. A method as claimed in claim 8, wherein the pre-back-grind under-fill layer comprises an opaque material to provide at least one of light, ultra-violet (UV) light, or radiation protection to a surface of the bumped-die or bumped wafer.

15. A method as claimed in claim 8, wherein the method is a flip-chip back-grind/mounting method.

16. A method comprising:
   providing a coating over a surface of a substrate having a bump, wherein the coating entirely covers the bump;
   grinding the back-side of the substrate to form a thinned substrate, wherein the coating provides a planarizing support layer during grinding; and
   flip-chip mounting the thinned substrate to a second substrate having a flip-chip land, wherein the coating provides an underfill material during flip-chip mounting.

17. A method as claimed in claim 16, further comprising:
   applying an adhesive protection tape to the coating.

18. A method as claimed in claim 16, wherein the coating comprises a thermoplastic material.

19. A method as claimed in claim 16, further comprising:
   dicing the thinned substrate, wherein dicing the thinned substrate occurs before flip chip mounting.

20. A method as claimed in claim 16, wherein the substrate comprises a semiconductor substrate having circuits on the surface and the second substrate comprises a printed wiring board.

21. A method as claimed in claim 16, wherein the coating is opaque.

22. A method as claimed in claim 16, wherein flip chip mounting comprises applying heat and pressure to plasticize the coating such that the coating flows and allows the bump and land to make electrical contact.

23. A method as claimed in claim 16, wherein providing the coating includes providing the coating with a thickness that extends above the bump to provide additional underfill material during the flip chip mounting.

* * * * *